United States Patent [19]

Kariya et al.

[11] Patent Number: 4,883,708

[45] Date of Patent: Nov. 28, 1989

[54] METAL FOIL COVERED LAMINATE

[75] Inventors: Kenichi Kariya; Masayuki Noda; Takahiro Yamaguchi; Katsuji Takahashi, all of Hikone, Japan

[73] Assignee: Shin-Kobe Electric Machinery Co., Ltd., Tokyo, Japan

[21] Appl. No.: 201,685

[22] Filed: Jun. 2, 1988

[30] Foreign Application Priority Data

Jun. 4, 1987 [JP] Japan .................................. 62-140188
Jun. 4, 1987 [JP] Japan .................................. 62-140189
Feb. 26, 1988 [JP] Japan .................................. 63-43445

[51] Int. Cl.$^4$ ......................... B32B 15/08; B32B 17/06
[52] U.S. Cl. .................................... 428/263; 428/265; 428/267; 428/268; 428/290; 428/458
[58] Field of Search ............... 428/458, 290, 291, 262, 428/263, 265, 267, 268

[56] References Cited

U.S. PATENT DOCUMENTS 4,762,747  8/1988  Lui et al. ............................... 428/458
4,786,541 11/1988  Nishimura et al. ............. 428/290 X
4,792,476 12/1988  Numata et al. ................. 428/458 X Primary Examiner—Thomas J. Herbert
Attorney, Agent, or Firm—Pearne, Gordon, McCoy & Granger

[57] ABSTRACT

A metal foil covered laminate comprising a sheet-like base formed of at least two of meta-aramid fiber, polyethylene terephthalate fiber and glass fiber and impregnated with epoxy resin including acrylonitrile/butadiene copolymer having terminal carboxyl groups and a metal foil covering on the sheet-like base.

7 Claims, No Drawings

METAL FOIL COVERED LAMINATE

BACKGROUND OF THE INVENTION

There has bee known a bendable metal foil covered board for a flexible printed circuit comprising a film of polymide or polyester and a metal foil covered on the film. Although such a metal foil covered board has a good characteristic of repeated bending, it has no reinforcing base, which causes a large shrinkage of the board in size due to heat applied thereto. This disadvantageously limits the range of use thereof.

There has been also known a metal foil covered laminate comprising a sheet-like base of glass nonwoven fiber or paper impregnated with thermosetting resin such as epoxy resin and phenol resin and a metal foil thermally adhered to the sheet-like base. Although such a laminate has a bending characteristic if it is relatively thinner, it is not suitable for using it in a bent condition because it will be easily damaged by bending it to an extreme degree such as more than 180 degree.

There has been proposed a metal foil covered laminate comprising a sheet-like base formed of nonwoven fiber which is a blend of glass fiber and polyester fiber impregnatd with epoxy resin and a metal foil thermally adhered to the sheet-like base as disclosed in extreme degree Japanese Pat. Application Laying-Open No. 184,587/1984. However, the laminate having conventional epoxy resin included therein is not suitable for use in a bent condition. The prior art does not disclose what type of epoxy resin is used for providing a bendable laminate.

An electronic instrument has a tendency to have minimized thickness and size, which requires a printed circuit board to be contained while bent in a small space. However, there has been proposed no printed circuit board having a good bending characteristic and a minimized size shrinkage.

SUMMARY OF THE INVENTION

Accordingly, it is a principal object of the invention to provide a metal foil covered laminate adapted to have an improved bending characteristic and a minimized size shrinkage.

It is another object of the invention to provide a metal foil covered laminate adapted to have a high tensile strength in addition to the improved bending characteristic and the prevention of size shrinkage.

It is further object of the invention to provide a metal foil covered laminate adapted to have an excellent heat resistance to soft solder.

In accordance with the present invention, there is provided a metal foil covered laminate comprising;

a sheet-like base formed of at least two of meta-aramid fiber, polyethylene terephthalate fiber and glass fiber and impregnated with epoxy resin including acrylonitrile/butadiene copolymer having terminal carboxyl groups;

and a metal foil covering on said sheet-like base.

The sheet-like base may be formed of meta-aramid fiber and polyethylene terephthalate fiber, of meta-aramid fiber and glass fiber or of glass fiber and polyethylene terephthalate fiber. Also, the sheet-like base may be of woven fiber or nonwoven fiber.

Acrylonitrile/butadiene copolymer is of high nitrile copolymer having a ratio of acrylonitrile of 10 to 30 weight % even though it is not limited thereto. The copolymer has carboxyl groups introduced into both ends of a main chain of the copolymer. It is esterified with epoxy resin having more than two oxirane (epoxy) groups to form preliminary condensation material. Such preliminary condensation material is used as it is or blended with epoxy resin.

Epoxy resin including acrylonitrile/butadiene copolymer having terminal carboxyl groups provides a good bending characteristic to the resin. As the amount of acrylonitrile included in the copolymer increases, the polarity is preferably strengthened so that adhesion and softness are provided to the resin.

Aramid fiber is a heat-resistant organic synthetic fiber having a major component of polymetaphenylene-isophthalamide which is formed of metaphenylene diamine and isophthalic acid chloride as major material. Aramid fiber has two bonding types: meta and para. The reason that aramid fiber used for the invention is limited to meta type is that meta-aramid fiber has an insulation resistance higher than para-aramid fiber because the former has better moisture to epoxy resin and that meta-aramid fiber has better die-cutting process properties than para-aramid fiber.

Thermal shrinkage of aramid fiber at a temperature of 200° C. is 0.5% while that of polyethylene terephthalate is 8%. This means that aramid fiber is close to the characteristic of inorganic glass fiber. Thus, it will be noted that size shrinkage of the laminate can be prevented by aramid fiber. Since the bent base is extended on a protruded or convex face while it is shrunk on a recessed or concave face, it is believed that as the flexibility of the laminate base is improved, it is useful for the bending characteristic. In measurement of expansion ratio of various fibers, the expansion ratio of meta-aramid fiber is 35% while that of polyethylene terephthalate fiber is about 45% which is better than that of meta-aramid fiber. This means that they provide a better bending characteristic to the laminate base together with epoxy resin.

With the sheet-like base formed of meta-aramid fiber and glass fiber, there is provided a laminate having a lower size shrinkage and an excellent thermal resistance to soft solder. This is believed true because the bending characteristic of the laminate base is improved by the higher expansion ratio of meta-aramid fiber relative to the expansion ratio of about 3% of glass fiber and also because the thermal shrinkage of both fibers is lower and the thermal resistance of both fibers is higher.

With the sheet-like base formed of glass fiber and polyethylene terephthalate fiber, there is provided a laminate having a good bending characteristic and prevention of size shrinkage. This is believed true because glass fiber has a stability of size to heat and polyethylene terephthalate fiber has a higher expansion ratio.

With the sheet-like base formed of woven fiber, there is provided a laminate having higher tensile strength because the tensile strength. This is believed true of the base of woven fiber is several times to ten and several times as much as that of the base of nonwoven fiber.

It will be noted that this invention can accomplish the objects of good bending characteristic and prevention of size shrinkage by a combination of specific resin and base.

It will be further noted that this invention can provide thermal resistance to soft solder and high tensile strength to the laminate.

It should be noted that the sheet-like base formed of only aramid fiber is not intended by the invention because it has lower die-cutting work process quality and moisture-resistance.

DETAILED DESCRIPTION OF EXAMPLES

The above and other objects and features of the invention will be apparent from the following description of examples of the invention.

With a sheet-like base of meta-aramid fiber and polyethylene terephthalate fiber used in the form of nonwoven cloth, the ratio of both fibers is not limited to a particular value. As the ratio of polyethylene terephthalate fiber increases, repeated bending and moisture-resistance will be much improved while the size shrinkage will be larger. Thus, it should be noted that the ratio of both fibers should be defined to a proper value.

In case of a sheet-like base of meta-aramid fiber and polyethylene terephthalate fiber used in theform of woven cloth, both fibers may be woven after they are together twisted into one thread or they may be woven after they are separately twisted into threads.

In case of the laminate base of woven cloth, the ratio of 40 weight % of meta-aramid fiber has a better result. As the ratio of meta-aramid fiber increaess, the die-cutting work process quality will be lowered.

In Examples 1 through 6, there were used sheet-like base of meta-aramid fiber and polyethylene terephthalate fiber.

EXAMPLE 1

80 weight parts of acrylonitrile/butadiene copolymer having carboxyl groups at both ends (tradename of CTBN 1300×8 manufactured by Ube Kosan Company, Japan), 100 weight parts of epoxy resin (tradename of EP-828 manufactured by Yuka Shell Company, Japan) and 0.26 weight parts of catalyst of triphenyl phosphine were combined and reacted with eachother at a temperature of 180° C. for 4 hours to obtain a preliminary reactant. To this reactant was added high polymeric epoxy resin (tradename of EP-1009 manufactured by Yuka Shell Company, Japan) so that 10 weight % of acrylonitrile/butadieneype copolymer was included in the resultant resin and it was blended with novolak type phenol resin as curing agent to obtain resin varnish.

Base material of meta-aramid fiber and polyethylene terephthalate fiber in the form of nonwoven cloth combined so that the weight ratio of meta-aramid fiber to polyethylene terephthalate fiber was 1/5 was impregnated with the resultant resin varnish so that the resin was contained by 80 %. After this was dried to obtain a prepreg, copper foils having a thickness of 35 μm were applied to both faces of the prepreg which was then subjected to a pressure of 30 kg/cm² at a temperature of 170° C. for 30 minutes to provide a both face copper foil covered laminate thickness of 0.2 mm.

EXAMPLE 2

A laminate was produced using the process of for producing the laminate of Example 1 except that the base of meta-aramid fiber and polyethylene terephthalate fiber in the form of nonwoven cloth were combined so that the weight ratio of meta-aramid fiber to polyethylene terephthalate fiber was 5/1.

Comparison 1

To epoxy resin (Tradename of EP-1001 manufactured by Yuka Shell Company, Japan) was added curing agent of dicyandiamide so that it was included by 4 weight % to obtain resin varinsh. The nonwoven cloth base of Example 1 was impregnated with the resultant resin varnish so that the resin was included by 80 weight % and dried to obtain a prepreg. Copper foils of 35 μm were faced with the prepreg and thermally pressurized in the same manner as described on Example 1 to obtain a both face copper foil covered laminate of 0.2 mm thickness.

Comparison 2

A prepreg was produced by impregnating a base of nonwoven glass fiber cloth with the resin varnish used in Example 1 so that the resin was included by 80 weight % and drying it. A both face copper foil covered laminate of 0.2 mm thickness was produced by using the resultant prepreg in the same manner as described in Example 1.

Comparison 3

A base of para-aramid fiber and polyethylene terephthalate fiber combined in the form of nonwoven cloth so that the weight ratio of para-aramid fiber to polyethylene terephthalate fiber was 1/5 was impregnated with the resin varnish used in Example I to produce a prepreg in the same manner as described in Example 1. A both face copper foil covered laminate of 0.2 mm thickness was produced by using the resultant prepreg in the same manner as described in Example 1.

Comparison 4

A base of only meta-aramid nonwoven fiber cloth was used to produce a prepreg and a both face copper foil covered laminate of 0.2 mm thickness was produced by using the resultant prepreg in the same manner was described in Example 1.

Prior Art 1

Copper foils of 35 fm thickness were adhered to both faces of a polyimide film (tradename of Kapton manufactured by Dupont) of 0.13 mm thickness.

Prior art 2

A prepreg was produced by impregnating a base of nonwoven glass fiber cloth with resin varnish used in Comparison 1 so that the resin was included by 80 weight % and drying it. A both face copper foil covered laminate of 0.2 mm thickness was produced by using the resultant prepreg in the same manner as described in Example 1.

Prior art 3

A paper base was impregnated with resol type phenol resin varnish so that the resin was included by 45 % and dried to obtain a prepreg. Copper foils of 35 μm were faced with the prepreg and subjected to a pressure of 100 kg/cm² at a temperature of 170° C. for 30 minutes to obtain a both face copper foil covered laminate of 0.2 mm thickness.

In Table I, the result are reported of characteristic tests of the laminates or sheets of Examples, Comparisons and Prior arts. In the table, "DCW" designates die-cutting work process quality, "RBD" designates 180 degree repeated bending characteristic, "IR" designates insulation resistance (D-2/100) and "SSR" designates size shrinkage ratio (E-0.5/150).

TABLE I

| | DCW | RBD | IR | SSR (%) |
|---|---|---|---|---|
| Example 1 | O | more than 10 times | $5 \times 10^{13}$ | 0.18 |
| Example 2 | O | 8 times | $2 \times 10^{13}$ | 0.15 |
| Comparison 1 | O | X | $8 \times 10^{12}$ | 0.17 |
| Comparison 2 | O | X | $6 \times 10^{12}$ | 0.10 |
| Comparison 3 | X | more than 10 times | $2 \times 10^{8}$ | 0.18 |
| Comparison 4 | Δ | 2 times | $7 \times 10^{12}$ | 0.14 |

TABLE I-continued

|  | DCW | RBD | IR | SSR (%) |
|---|---|---|---|---|
| Prior art 1 | Δ | more than 10 times | $2 \times 10^{12}$ | 0.55 |
| Prior art 2 | O | X | $5 \times 10^{12}$ | 0.08 |
| Prior art 3 | O | X | $8 \times 10^9$ | 0.15 |

The characteristic tests were made in the following manner.

(1) Die-cutting work process quality (DCW)

The materials were punched by ASTM process and the finished condition of holes and peripheries thereof were examined. In the result, "" indicates a good result, "Δ" indicates that some naps or fins remain being uncut and "X" indicates much fiber naps remain being uncut.

(2) 180 degree repeated bending characteristic (RBC)

This test was made by repeatedly bending through 180 degrees the test pieces obtained by cutting the materials by a size of 20×100 mm in a lateral direction in which they were lower in their strength. The bending tests were made by counting the number of bends or flexures within the limit of 10 until a crack sufficient to hinder the laminates use in practice occups at the bend. In the result, "X" indicates that the pieces were broken by a single bending.

(3) Insulation resistance (IR)

This was measured by JIS-C06481 process.

(4) Size shrikage ratio (SSR)

This test was made by removing copper foils out of the test pieces obtained by cutting the materials to a size of 20×300 mm and measuring longitudinal and lateral sizes before and after the test pieces were thermally processed in anoven of 150° C. for 30 minutes. The size shrinkage ratio was obtained from the maximum value of size shrinkage ratio measured by the following expression.

Size shrinkage ratio (%) =

(Size before thermal process—size after thermal process)×100/size before thermal process

EXAMPLES 3 TO 5

30 weight parts of acrylonitrile/butadiene copolymer having carboxyl groups at both ends, 40 weight parts of nonflammable epoxy resin (epoxy equivalent of 400 and bromine inclusion ratio of 48 %, tradname of YDB-400 manufactured by Tohto Kasei Company, Japan), 20 weight parts of epoxy resin (epoxy equivalent of 195, tradename of EP-828 manufactured by Yuka Shell Company, Japan) and 10 weight parts of cresol novolak epoxy resin (epoxy equivalent of 210, tradename of YDCM-704 manufactured by Tohto Kasei Company, Japan) were reacted with each other under catalyst of triphenyl phosphine at a temperature of 180° C. for 4 hours. This reactant was blended with curing agent of dicyandiamide to prepare varnish.

There was prepared base material of woven cloth of meta-aramid fiber and polyethylene terephthalate fiber combined in the form of threads with the ratio of warp to woof of 12/11. In Examples 3, 4 and 5, the ratios of meta aramid fiber were 10 weight %, 40 weight % and 70 weight %, respectively. A prepreg was prepared by impregnating the respective base materials of woven cloth with the aforementioned varnish so that the resin was contained by 60 % and drying it. Copper foils having a thickness of 35 μm were applied to both faces of the prepreg and it was subjected to a pressure of 30 kg/cm² at a temperature of 170° C. for 30 minutes to provide a both face copper foil covered laminate of thickness of 0.6 mm.

EXAMPLE 6

There was prepared a base of woven cloth formed of meta-aramid fiber thread and polyethylene terephthalate fiber thread. The thread diameter and number were so adjusted that the ratio of meta-aramid fiber is 40 weight %. A both face copper foil covered laminate of 0.6 mm thickness was produced by using the aforementioned base in the same manner as described with reference to Example 3.

Comparison 5

90 weight parts of nonflammable epoxy resin (epoxy equivalent of 500 and bromine inclusion ratio of 22 %, tradename of ESB-500 manufactured by Tohto Kasei Company, Japan), 10 weight parts of YDCN-704 and 3 weight parts of curing agent of dicyandiamide were blended to prepare varinsh. The woven fiber base of Example 4 was impregnated with the resultant varnish to obtain a prepreg. From the prepreg was produced a both face copper foil covered laminate of 0.6 mm thickness in the same manner as described on

EXAMPLE 4.

In Table II, the results are reported of characteristic tests of the laminates of Examples 3 to 6, Comparison 5 together with that of Prior art 1. In the table, "DCW" and "SSR" designate the same as in Table I while "BAF" designates blend ratio (%) of aramid fiber, "BC" designates a bending characteristic (MM) and "TS" designates tensile strength (Kg/mm²).

TABLE II

|  | DCW | BAF | BC | TS | SSR (%) |
|---|---|---|---|---|---|
| Example 3 | O | 10 | 2.5 | 23 | 0.25 |
| Example 4 | O | 40 | 2.8 | 28 | 0.20 |
| Example 5 | Δ | 70 | 2.9 | 30 | 0.17 |
| Example 6 | O | 40 | 2.8 | 28 | 0.20 |
| Comparison 5 | O | 40 | 10.5 | 29 | 0.36 |
| Prior art 1 | Δ | — | freely bent | 3 | 0.55 |

The table II, the test of bending characteristic was made by measuring the minimum bending radius of the laminates at which the laminates were neither broken nor cracked. The tensile strength was measured by JIS-C-6481. The other tests were made in the same manner as described on Table 1.

In Examples 7 and 8, there were used a sheet-like base of meta-aramid fiber and glass fiber. Although the blend ratio of meta-aramid fiber to glass fiber is not defined to be a specific value as the amount of glass fiber increases, the size shrinkage will be substantially restricted bending, but the characteristic will be deteriorated. Thus, it should be noted that the ratio of them should be set at a proper value.

EXAMPLE 7

A base of meta-aramid fiber and E glass fiber having a fiber diameter of 9μ and a length of 25 mm were combined in the form of nonwoven cloth so that the weight ratio of meta-aramid fiber to E glass fiber was 2/1. This base was impregnated with the resin varnish used in Example 1 and dried to produce a prepreg in the same manner as described in Example 1. Copper foils having a thickness of 35 μm were faced to both faces of the prepreg and it was subjected to a pressure of 30 kg/cm² at a temperature of 170° C. for 30 minutes to provide a both face copper foil covered laminate of thickness of 0.2 mm.

EXAMPLE 8

There was prepared a base of nonwoven cloth formed of meta-aramid fiber and E glass fiber in combination so that the weight ratio of meta-aramid fiber to E glass fiber was ½. A both face copper foil covered laminate of 0.2 mm thickness was produced by using the base in the same manner as described on Example 7.

Comparison 6

To epoxy resin (Tradename of EP-1001 manufactured by Yuka Shell Company, Japan) was added curing agent of dicyandiamide so that it was included by 4 weight % to obtain resin varnish. The nonwoven fiber base of Example 7 was impregnated with the resultant resin varnish so that the resin was included by 80 weight % and dried to obtain a prepreg. Copper foils of 35 μ were faced to the prepreg and subjected to the pressure in the same manner as described on Example 7 to obtain a both face copper foil covered laminate of 0.2 mm thickness.

Comparison 7

There was prepared a base of nonwoven cloth formed of para-aramid fiber and E glass fiber in combination so that the weight ratio of para-aramid fiber to E glass fiber was ½. A both face copper foil covered laminate of 0.2 mm thickness was produced by using the base in the same manner as described on Example 7.

In Table II, the results are reported of characteristic tests of the laminates of Examples 7 and 8 and Comparisons 6 and 7 together with those of Prior arts 1 through 3. In the table, "DCW", "IR" and "SSR" designate the same as in Table I while "180BC" designates the characteristic of bending by 180 degree and "TR" (second) designates thermal resistance to soft solder at 260° C. (D-2/100).

TABLE III

| | DCW | 180BC | TR | IR | SSR (%) |
|---|---|---|---|---|---|
| Example 7 | O | O | 40 to 60 | $8 \times 10^{12}$ | 0.12 |
| Example 8 | O | O~Δ | 40 to 60 | $8 \times 10^{12}$ | 0.11 |
| Comparison 6 | O | X | 40 to 60 | $7 \times 10^{12}$ | 0.11 |
| Comparison 7 | X | O | 10 to 20 | $2 \times 10^{8}$ | 0.12 |
| Prior art 1 | Δ | O | 5 | $2 \times 10^{12}$ | 0.55 |
| Prior art 2 | O | X | 40 to 60 | $5 \times 10^{12}$ | 0.08 |
| Prior art 3 | O | X | 15 | $8 \times 10^{9}$ | 0.15 |

In Table III, the test of characteristic of bending by 180 degree was made by determining the occurence of cracks in the test pieces obtained by cutting the materials to a size of 20×100 mm when they are bent by 80 degree. In the test of 180 BC, "" indicates that there was no crack, "Δ" indicates that there was such a fine crack as has no problem in practice and "X" indicates that the test pieces were broken and could not be practically used. The test of thermal resistance to soft solder was made by JIS-C-6481. The other tests were made in the same manner as described on Table I.

In Examples 9 through 11, there were used a sheet-like base of threads of a combination of glass fiber and polyethylene terephthalate fiber. Although the blend ratio of meta-aramid fiber to glass fiber is not defined to be a specific value in case of the blend ratio of glass fiber being 10 weight %, the better result was obtained. As the blend ratio of glass fiber increases, the bending chracteristic is lowered, but the size stablity is improved.

EXAMPLE 9 TO 11

There was prepared base material of woven cloth of glass fiber and polyethylene terephthalate fiber combined in the form of threads with the ratio of warp to woof of 4/3. In Examples 9, 10 and 11, the ratios of glass fiber were 5 weight %, 10 weight % and 30 weight %, respectively. A prepreg was prepared by impregnating the respective base materials of woven cloth with the varnish used in Example 3 so that the resin was contained by 60% and drying it. A both face copper foil covered laminate of thickness of 0.6 mm was produced in the same manner as described on Example 3.

EXAMPLE 12

There was prepared a base of woven cloth formed of glass fiber thread and polyethylene terephthalate fiber thread, the thread diameter and number being adjusted that the ratio of glass fiber was 10 weight %. A both face copper foil covered laminate of 0.6 mm thickness was produced by using the aforementioned base in the same manner as desribed with reference to Example 9.

EXAMPLE 13

Using a base of nonwoven cloth formed of glass fiber and polyethylene terephthalate fiber combined so that the ratio of glass fiber was 10 weight %, a laminate of 0.6 mm thickness in the same manner as described on Example 9.

Comparison 8

By impregnating the woven cloth of Example 10 with the varnish of Comparison 5, was produced a both face copper film covered laminate of 0.6 mm thickness.

In Table IV, the results are reported of characteristic tests of the laminates of Examples 9 through 13 and Comparison 8 together with that of Prior art 1. In the table, "BC", "SSR" and "TS" designate the same as in Table II whle "BRG" designates blend ratio (%) of glass fiber.

TABLE IV

| | BRG | BC | SSR (%) | TS |
|---|---|---|---|---|
| Example 9 | 5 | 3.5 | 0.45 | 25 |
| Example 10 | 10 | 4.0 | 0.25 | 28 |
| Example 11 | 30 | 6.5 | 0.20 | 30 |
| Example 12 | 10 | 4.0 | 0.25 | 28 |
| Example 13 | 10 | 4.0 | 0.28 | 10 |
| Example 8 | 10 | 15.5 | 0.23 | 29 |
| Comparison 8 | 10 | 15.5 | 0.23 | 29 |
| Prior art 1 | — | freely bent | 0.55 | 3 |

Although some examples of the invention have been illustrated and described, it wil be understood by those skilled in the art that various changes and modifications may be made without departing from the spirit and scope of the invention, which is intended to be defined only by the appended claims.

What is claimed is:

1. A metal foil covered laminate comprising:
   a sheet-like base formed of at last two of meta-aramic fiber, polyethylene terephthalate fiber and glass fiber and impregnated with preliminary condensation material formed by acrylonitrile/butadiene copolymer having terminal carboxyl groups esterified with apoxy resin having more than two epoxy groups;

and a metal foil covering on at least one face of said sheet-like base.

2. A metal foil covered laminate as set forth in claim 1, and wherein said sheet-like base is formed of meta-aramid fiber and polyethylene terephthalate fiber.

3. A metal foil covered laminate as set forth in claim 1, and wherein said sheet-like base is formed of meta-aramid fiber and glass fiber.

4. A metal foil covered laminate as set forth in claim 1, and wherein said sheet-liek base is formed of glass fiber and polyethylene terephthalate fiber.

5. A metal foil covered laminate as set forth in claim 1, and wherein said sheet-like base is in the form of nonwoven cloth.

6. A metal foil covered laminate as set forth in claim 1, and wherein said sheet-like base is in the form of woven cloth.

7. A metal foil covered laminate comprising a sheet-like base formed of at least two of meta-aramid fiber, polyethylene terephthalate fiber and glass fiber and impregnated with components of epoxy resin combined with preliminary condensation material formed by acrylonitrile/butadiene copolymer having terminal carboxyl groups esterified with epoxy resin having more than two epoxy groups.

* * * * *